(12) United States Patent
Kim

(10) Patent No.: US 10,515,698 B2
(45) Date of Patent: Dec. 24, 2019

(54) FERROELECTRIC MEMORY DEVICE AND METHOD OF MANUFACTURING THE SAME

(71) Applicant: SK hynix Inc., Icheon-si (KR)

(72) Inventor: Joong Sik Kim, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/884,615

(22) Filed: Jan. 31, 2018

(65) Prior Publication Data

US 2018/0277212 A1    Sep. 27, 2018

(30) Foreign Application Priority Data

Mar. 21, 2017    (KR) ........................ 10-2017-0035342

(51) Int. Cl.
| | |
|---|---|
| H01L 29/78 | (2006.01) |
| G11C 14/00 | (2006.01) |
| H01L 29/51 | (2006.01) |
| H01L 29/08 | (2006.01) |
| H01L 29/10 | (2006.01) |
| H01L 27/1159 | (2017.01) |
| H01L 29/423 | (2006.01) |
| H01L 45/00 | (2006.01) |
| H01L 29/40 | (2006.01) |

(Continued)

(52) U.S. Cl.
CPC ........ *G11C 14/0027* (2013.01); *G11C 11/223* (2013.01); *G11C 11/2273* (2013.01); *H01L 21/28291* (2013.01); *H01L 27/1159* (2013.01); *H01L 29/0847* (2013.01); *H01L 29/1037* (2013.01); *H01L 29/1083* (2013.01); *H01L 29/408* (2013.01); *H01L 29/4236* (2013.01); *H01L 29/42368* (2013.01); *H01L 29/513* (2013.01); *H01L 29/516* (2013.01); *H01L 29/518* (2013.01); *H01L 45/14* (2013.01)

(58) Field of Classification Search
None
See application file for complete search history.

(56) References Cited

U.S. PATENT DOCUMENTS

| | | | |
|---|---|---|---|
| 9,263,672 B2 | 2/2016 | Ramaswamy et al. | |
| 2004/0041208 A1* | 3/2004 | Bhattacharyya ... | G11C 16/0466 257/347 |

(Continued)

FOREIGN PATENT DOCUMENTS

KR    10-2006-0075079 A    7/2006

*Primary Examiner* — Joseph C. Nicely
*Assistant Examiner* — Lamont B Koo

(57) ABSTRACT

The ferroelectric memory device includes a substrate having a base doped region doped with a dopant of a first conductivity type and a trench disposed in the base doped region having an inner wall with a bottom and sidewalls. Also, the ferroelectric memory device includes a ferroelectric gate insulation layer, disposed along the inner wall of the trench, a gate electrode layer disposed on the ferroelectric gate insulation layer inside the trench, and a source region and a drain region, disposed in the substrate at respective ends of the trench and doped with a dopant of a second conductivity type. The ferroelectric memory device also includes a conductive well region, doped with a dopant of the second conductivity type. The conductive well region is disposed in the base doped region and spaced apart from the ferroelectric gate insulation layer.

11 Claims, 10 Drawing Sheets

(51) Int. Cl.
    *H01L 21/28*     (2006.01)
    *G11C 11/22*     (2006.01)

(56) References Cited

U.S. PATENT DOCUMENTS

| | | | |
|---|---|---|---|
| 2004/0132256 A1* | 7/2004 | Kim | H01L 29/66492 438/296 |
| 2014/0138753 A1* | 5/2014 | Ramaswamy | H01L 21/28291 257/295 |
| 2017/0358684 A1* | 12/2017 | Chen | H01L 29/78391 |

* cited by examiner

FERROELECTRIC MEMORY DEVICE AND METHOD OF MANUFACTURING THE SAME

CROSS-REFERENCE TO RELATED APPLICATION

The present application claims priority under 35 U.S.C. 119(a) to Korean Patent Application No. 10-2017-0035342, filed on Mar. 21, 2017, which is herein incorporated by reference in its entirety.

BACKGROUND

1. Technical Field

Embodiments of the present disclosure relate to a ferroelectric memory device and a method of manufacturing the same.

2. Related Art

Generally, a ferroelectric material is a material having spontaneous electrical polarization in the absence of an applied external electric field. More specifically, a ferroelectric material can maintain one of two stable remanent polarization states. Thus, a ferroelectric material may be utilized to store digital information in a nonvolatile manner. For example, binary information "0" or "1" may be stored in remanent polarization states.

Remanent polarization states in a ferroelectric material can be reversibly switched by applying an external electric field. The application of ferroelectric materials in nonvolatile memory devices has been actively studied. As an example, perovskite materials, which can manifest ferroelectric properties or characteristics, such as zirconate titanate (PZT) or strontium bismuth tantalite (SBT) have been studied for applications in nonvolatile memory devices.

In order for a ferroelectric material to be effectively used in a nonvolatile memory device, a ferroelectric material layer in the device should maintain a ferroelectric property in a stable manner and without change or deviation during a device operation.

SUMMARY

There is provided a ferroelectric memory device according to an aspect of the present disclosure. The ferroelectric memory device includes a substrate having a base doped region with a dopant of a first conductivity type and a trench disposed in the base doped region having an inner wall with a bottom and sidewalls. Also, the ferroelectric memory device includes a ferroelectric gate insulation layer, disposed along the inner wall of the trench, a gate electrode layer disposed on the ferroelectric gate insulation layer inside the trench, and a source region and a drain region, each with a dopant of a second conductivity type, and each disposed in the substrate at respective ends of the trench. The ferroelectric memory device also includes a conductive well region with a dopant of the second conductivity type. The conductive well region is disposed in the base doped region and spaced apart from the ferroelectric gate insulation layer.

There is provided a ferroelectric memory device according to another aspect of the present disclosure. The ferroelectric memory device includes a substrate having a base doped region with a dopant of a first conductivity type. The ferroelectric memory device also includes a ferroelectric gate insulation layer and a gate electrode layer that are sequentially disposed along an inner wall of a trench formed in the base doped region; a source region and a drain region, each with a dopant of a second conductivity type, and disposed in a substrate region at respective ends of the trench; and a conductive well region, including conductive carriers, disposed below the trench in the base doped region. The conductive well region has the dopant of the second conductivity type. When a gate voltage is applied to the gate electrode layer, conductive carriers of different densities are induced from the conductive well region.

There is provided a method of manufacturing a ferroelectric memory device according to another aspect of the present disclosure. In the method, a substrate is prepared having a base doped region with a dopant of a first conductivity type. A trench is formed in the base doped region. A dopant of a second conductivity type is injected into the substrate to form a conductive well region in the base doped region below the trench. A ferroelectric gate insulation layer is formed along an inner wall of the trench. A gate electrode layer is formed on the ferroelectric gate insulation layer inside the trench. A source region and a drain region, each with a dopant of the second conductivity type, are formed in substrate regions at respective ends or sides of the trench.

DETAILED DESCRIPTION

Figure 1:
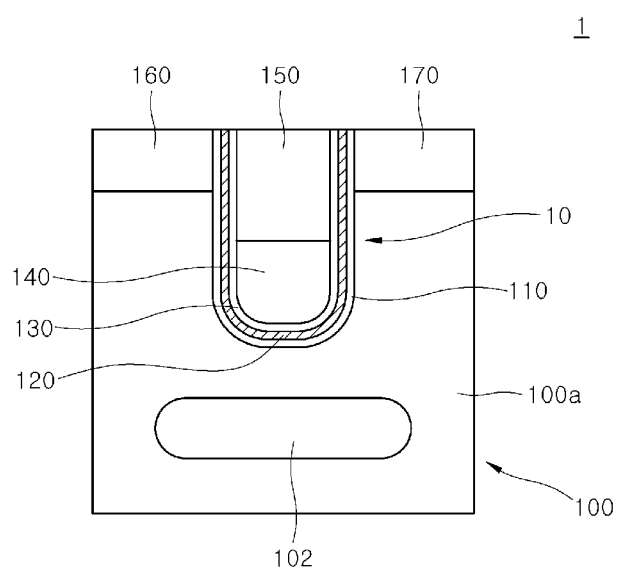
FIG. 1 is a cross-sectional view schematically illustrating the ferroelectric memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If a first element is referred to be located on a second element, it may be understood that the first element is directly located on the second element; that an additional element may be interposed between the first element and the second element; or that a portion of the first element is directly located on a portion of the second element. The same reference numerals may refer to the same elements throughout the specification.

In addition, expression of a singular form of a word includes the plural forms of the word unless clearly used otherwise in the context of the disclosure. The terms "comprise", "have", or "include" are intended to specify the presence of a feature, a number, a step, an operation, an element, a component, a part, or combinations thereof, but the terms do not preclude the presence or possibility of the addition of one or more other features, numbers, steps, operations, elements, components, parts, or combinations thereof.

Further, each step or process in a method or a manufacturing method need not be performed in any order set forth in the disclosure unless a specific sequence is explicitly described. In other words, each step or process in a method or manufacturing method disclosed herein may be performed sequentially in the stated order, may be performed out of sequence from the stated order, or may be performed substantially at the same time as one or more other steps or processes. The steps or processes may also be performed in a reverse order.

The terms 'doping type of a first type' and the 'doping type of a second type' described herein may mean different dopant types realized by impurities injected into a base material. As an example, when the doping type of a first type is an n-type, the doping type of a second type may be a p-type. As another example, when the doping type of the first type is a p-type, the doping type of a second type may be an n-type.

An embodiment of the present disclosure may provide a ferroelectric memory device having a conductive well region that is electrically floated in a substrate region below a ferroelectric gate insulation layer. Here, a plurality of logic states, including a first logic state having a relatively low channel resistance or a second logic state having a relatively high channel resistance, can be implemented between a source region and a drain region depending on the orientation of a remanent polarization in the ferroelectric gate insulation layer. In addition, an embodiment of the present disclosure may provide a method of manufacturing the above-described ferroelectric memory device.

FIG. 1 is a cross-sectional view schematically illustrating a ferroelectric memory device according to an embodiment of the present disclosure. Referring to FIG. 1, in an embodiment, a ferroelectric memory device 1 may include a substrate 100 having a base doped region 100a doped with a dopant of a first conductivity type, and a conductive well region 102 doped with a dopant of a second conductivity type and located within the base doped region 100a. The ferroelectric memory device 1 may include a ferroelectric gate insulation layer 120 and a gate electrode layer 130 that are sequentially disposed in a trench 10 formed over the conductive well region 102.

The substrate 100 may include a semiconductor material. The substrate 100 may be a silicon (Si) substrate or a germanium (Ge) substrate, as non-limiting examples. As another example, the substrate 100 may be a compound semiconductor substrate such as a gallium arsenide (GaAs) substrate. The base doped region 100a may, for example, be doped with a dopant of an n-type or p-type conductivity type.

In an embodiment, a base doped region 100a may correspond to a portion of a substrate 100. In this case, dopants of a first conductivity type may be locally implanted into the substrate to form the base doped region 100a. In another embodiment, the base doped region 100a may be formed over the entire surface of the substrate 100. In some cases, a commercially available substrate prepared by doping with a dopant of the first conductivity type can be utilized.

A conductive well region 102 doped with a dopant of a second conductivity type may be disposed in the base doped region 100a. The conductive well region 102 may, for example, be doped with a dopant of an n-type or p-type conductivity. The conductive well region 102 may be disposed in the base doped region 100a such that it is spaced apart from a ferroelectric gate insulation layer 120. The conductive well region 102 may form a p-n junction with the base doped region 100a.

Referring to FIG. 1, in an embodiment, a trench 10 may be formed in the base doped region 100a. The trench 10 may be formed to extend from a surface of the substrate 100 to an inner region of the base doped region 100a. In one embodiment, the trench 10 may be formed over, and spaced apart from, the conductive well region 102.

An interfacial insulation layer 110 may be disposed along an inner wall of the trench 10. The interfacial insulation layer 110 may, for example, include a nitride material, an oxide material or an oxynitride material. The interfacial insulation layer 110 may include a silicon oxide material, a silicon nitride material, a silicon oxynitride material, an aluminum oxide material, or a combination of two or more thereof, as non-limiting examples.

The interfacial insulation layer 110 may function to suppress diffusion of materials between the substrate 100 and the ferroelectric gate insulation layer 120. In addition, the interfacial insulation layer 110 may function to inhibit transfer of electric charges conducting through the channel of the substrate 100 to the ferroelectric gate insulation layer 120 during a read operation of the ferroelectric memory device 1. In some embodiments, the interfacial insulation layer 110 may be omitted.

The ferroelectric gate insulation layer 120 may be disposed over the interfacial insulation layer 110. The ferroelectric gate insulation layer 120 may include a ferroelectric material. The ferroelectric gate insulation layer 120 may include a hafnium oxide material, a zirconium oxide material, a hafnium zirconium oxide material, or a combination of two or more thereof, as non-limiting examples. In an embodiment, the ferroelectric gate insulation layer 120 may include at least one dopant. The dopant may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof, as non-limiting examples.

The ferroelectric gate insulation layer 120 may have a remanent polarization due to a ferroelectric material. The remanent polarization can control channel resistance by inducing movement of charges such as electrons or holes in the base doped region 100a towards or away from the ferroelectric gate insulation layer 120. The remanent polarization may have a plurality of orientation states, and the channel resistance determined according to the plurality of orientation states allows the ferroelectric memory device to implement a plurality of logic states.

The gate electrode layer 130 may be disposed on the ferroelectric insulation layer 120. A voltage may be applied to the ferroelectric gate insulation layer 120 through the gate electrode layer 130 to change the orientation of a remanent polarization of the ferroelectric gate insulation layer 120.

The gate electrode layer 130 may include a conductive material. The gate electrode layer 130 may include tungsten (W), titanium (Ti), copper (Cu), aluminum (Al), platinum (Pt), iridium (Ir), ruthenium (Ru), a tungsten nitride material, a titanium nitride material, a tantalum nitride material, an iridium oxide material, a ruthenium oxide material, a tungsten carbide material, a titanium carbide material, a tungsten silicide material, a titanium silicide material, a tantalum silicide material, or a combination or an alloy of two or more thereof, as non-limiting examples. The gate electrode layer 130 may be formed in a single layer or in multiple layers.

A conductive layer 140 may be disposed to fill at least a portion of the trench 10. The conductive layer 140 may be in contact with at least a portion of the gate electrode layer 130. The conductive layer 140 may include a conductive material. The conductive layer 140 may include tungsten (W), titanium (Ti), copper (Cu), aluminum (Al), platinum (Pt), iridium (Ir), ruthenium (Ru), a tungsten nitride material, a titanium nitride material, a tantalum nitride material, an iridium oxide material, a ruthenium oxide material, a tungsten carbide material, a titanium carbide material, a tungsten silicide material, a titanium silicide material, a tantalum silicide material, or a combination or an alloy of two or more thereof, as non-limiting examples. The conductive layer 140 may be formed as a single layer or in multiple layers.

A capping insulation layer 150 may be disposed over the conductive layer 140 to fill the trench 10. The capping insulation layer 150 may, for example, include an oxide material, a nitride material, or an oxynitride material.

A source region 160 and a drain region 170 may be disposed in the substrate 100 at respective ends, or on respective sides, of the trench 10. The source and drain regions, 160 and 170 respectively, may be doped to have a second conductivity type. Specifically, the source and drain regions, 160 and 170 respectively, may, for example, each be doped with a dopant of an n-type conductivity or a p-type conductivity.

In a first doping example, a substrate 100 may be a silicon substrate having a p-type doped region as the base doped region 100a. Each of the source region 160 and drain region 170 may be an n-type doped region in contact with the base doped region 100a. The conductive well region 102 may be an n-type doped region formed inside the p-type base doped region 100a.

In a second doping example, a substrate 100 may be a silicon substrate having an n-type doped region as the base doped region 100a. Each of the source and drain regions, 160 and 170 respectively, may be a p-type doped region in contact with the base doped region 100a. The conductive well region 102 may be a p-type doped region formed inside the n-type base doped region 100a.

Figure 2:
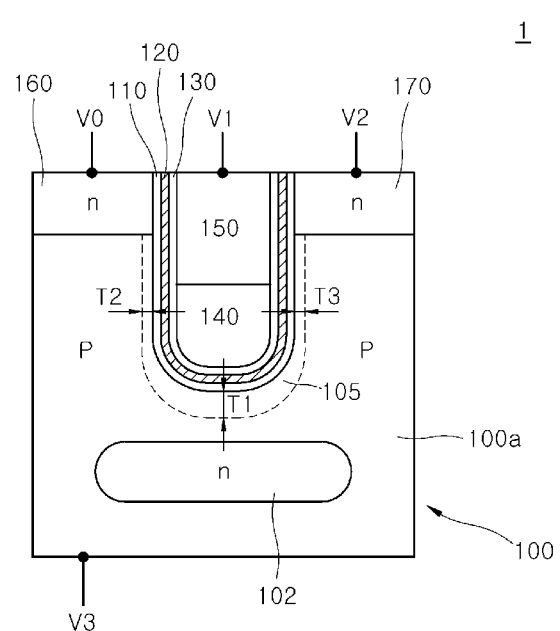
FIGS. 2 and 3 are cross-sectional views schematically illustrating a read operation of a ferroelectric memory device according to embodiments of the present disclosure.
Figure 3:
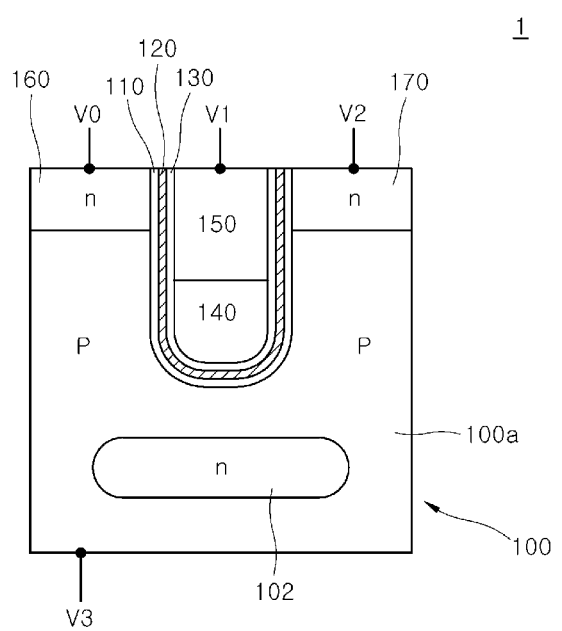

FIGS. 2 and 3 are cross-sectional views schematically illustrating a read operation of a ferroelectric memory device according to embodiments of the present disclosure. More specifically, FIG. 2 illustrates a read operation in which a ferroelectric memory device 1 has a first logic state corresponding to a relatively low channel resistance, and FIG. 3 illustrates a read operation in which a ferroelectric memory device 1 has a second logic state corresponding to a relatively high channel resistance.

In an example, the first logic state or the second logic state can be obtained in advance by applying a first or a second program voltage of different polarity with each other between the gate electrode layer 130 and the base doped region 100a. In the first doping example, the application of the first program voltage may be performed by applying a bias having a positive polarity to the gate electrode layer 130 while grounding the base doped region 100a. Accordingly, a remanent polarization having a first polarization orientation that is oriented from the gate electrode layer 130 to the base doped region 100a may be stored in the ferroelectric gate insulation layer 120. Meanwhile, the application of the second program voltage may be performed by applying a bias having a negative polarity to the gate electrode layer 130 while grounding the base doped region 100a. Accordingly, a remanent polarization having a second polarization orientation that is oriented from the base doped region 100a to the gate electrode layer 130 may be stored in the ferroelectric gate insulation layer 120. Meanwhile, in the second doping example, the application of the first program voltage may be performed by applying a bias having a negative polarity to the gate electrode layer 130 while grounding the base doped region 100a is grounded. And, the application of the second program voltage may be performed by applying a bias having a positive polarity to the gate electrode layer 130 while grounding the base doped region 100a is grounded.

While FIGS. 2 and 3 illustrate read operations of a ferroelectric memory device 1 utilizing a doping structure described above in the first doping example, the present disclosure is not limited thereto. Read operations can also take place in substantially the same manner in a ferroelectric memory device 1 utilizing the doping structure described above in the second doping example.

Referring to FIG. 2, in an embodiment, substrate 100 may have a base doped region 100a, doped to have p-type conductivity. The source region 160 and drain region 170 may be n-type doped regions, and the conductive well region 102 may be an n-type doped region. A remanent polarization in the ferroelectric gate insulation layer 120 may implement or establish a polarization orientation of the first logic state.

In an example, a read operation of the ferroelectric memory device 1 may be performed when an electric potential V1 is applied to the gate electrode layer 130, electric potentials V0 and V2 are applied to the source region 160 and drain region 170 respectively, and an electric potential V3 is applied to the base doped region 100a. The electric potentials V1, V2 and V3 may be higher than the electric potential V0. The conductive well region 102 may be electrically floated.

A gate voltage applied to the gate electrode layer 130 may be determined by an electrical potential difference between V1 and V3. The gate voltage may be sufficient to induce formation of a channel layer 105, which is a low resistance conductive path in the base doped region 100a, without altering the orientation of the remanent polarization in the ferroelectric gate insulation layer 120. When the gate voltage is applied to the gate electrode layer 130, the conductive well region 102 may provide conductive carriers that move from the conductive well region 102 towards an interface region between the interfacial insulation layer 110 and the base doped region 100a. The conductive carriers may be electrons. As a result, when channel layer 105 is formed, a thickness t1 of the channel layer 105 in the base doped region 100a located under or adjacent to the bottom surface of the trench 10 may be greater than the thicknesses t2 and t3 of the channel layer 105 formed in the base doping region 100a and adjacent to opposite sidewalls of the trench 10.

Referring again to FIG. 2, while maintaining the gate voltage applied to the gate electrode layer 130, a read operation voltage may be applied between the source region 160 and the drain region 170 in the presence of a channel layer 105 in the base doped region 100a. The read operation voltage may be determined by an electrical potential difference between V2 and V0 applied to the drain region 170 and source region 160 respectively. An electrical potential V3, higher than V0 and lower than V2, may be applied to the base doped region 100a. The conductive well region 102 may be electrically floated. Accordingly, when the read operation voltage is applied, a forward p-n junction may be formed between the source region 160 and the base doped region 100a, and a reverse p-n junction may be formed between the base doped region 100a and the drain region 170. Accordingly, a bipolar junction switching operation can be performed by an n-p-n bipolar junction formed among the source region 160, the base doped region 100a, and the conductive well region 102. A bipolar junction switching operation may also be performed by an n-p-n bipolar junction formed among the conductive well region 102, the base doped region 100a, and the drain region 170. A bipolar junction switching operation may result in electron conduction from the source region 160 to the drain region 170. The electron conduction from the source region 160 to the drain region 170 can be facilitated by channel layer 105.

When a read operation voltage is applied, the density of electrons conducting between the source region 160 and the drain region 170 can be increased by a bipolar junction switching operation. Thus, channel resistance in a ferroelectric memory device 1 can be further reduced in the implementation of a first logic state.

Referring to FIG. 3, in an embodiment, a remanent polarization orientation in ferroelectric gate insulation layer 120 of a ferroelectric memory device 1 may be maintained in the implementation of a second logic state. In this case, a gate voltage applied to the gate electrode layer 130 may be insufficient to induce formation of a low resistance conduction path such as the channel layer 105 illustrated in FIG. 2. The gate voltage may also be insufficient to induce the movement of conductive carriers from a conductive well region 102 towards an interface region between the based doped region 100a and interfacial insulation layer 110.

In the absence of a low resistance conduction path, and in the absence of conductive carriers issuing from conductive well region 102, when an read operation voltage is then applied between the source region 160 and the drain region 170, a bipolar junction switching operation may still occur. However, electron conduction may be inefficient and may not proceed effectively despite a bipolar junction switching operation. Accordingly, when the read operation voltage is applied, a relatively high channel resistance is maintained between the source region 160 and the drain region 170.

As described above, a ferroelectric memory device according to an embodiment of the present disclosure may have a conductive well region that is electrically floated in a base doped region adjacent to a ferroelectric gate insulation layer. A plurality of logic states can be implemented in a ferroelectric memory device depending on the orientation of the remanent polarization in the ferroelectric gate insulation layer, including a first logic state corresponding to a relatively low channel resistance between the source region and drain region or a second logic state corresponding to a relatively high channel resistance between the source region and drain region.

According to an embodiment, in a read operation for a first logic state in a ferroelectric memory device, a conductive well region may provide electric charges that move toward a ferroelectric gate insulation layer. The electric charges locally increase the thickness of a channel layer. As a result, the channel resistance is reduced when reading a first logic state. In another example, in a read operation for a first logic state in a ferroelectric memory device, a conductive well region, a source region and a drain region doped with a dopant of a first conductivity type, and a base doped region doped with a dopant of a second conductivity type, constitute a bipolar junction that performs switching operations. As a result, the amount of charges conducting between the source region and drain region increases, which reduces channel resistance and increases a read margin between the first logic state and a second logic state.

In another example, the magnitude of a gate voltage, applied to a gate electrode layer in a ferroelectric memory device, required by a read operation can be reduced by decreasing the channel resistance corresponding to a first logic state, utilizing the charges moving from a conductive well region. Accordingly, it is possible to prevent, suppress or impede a gate voltage applied to a predetermined target memory cell from changing polarization information stored in a ferroelectric gate insulation layer of a memory cell adjacent to the predetermined memory cell, when the gate electrode layer of the predetermined memory cell is electrically connected to a plurality of ferroelectric memory cells through a word line.

Figure 4:
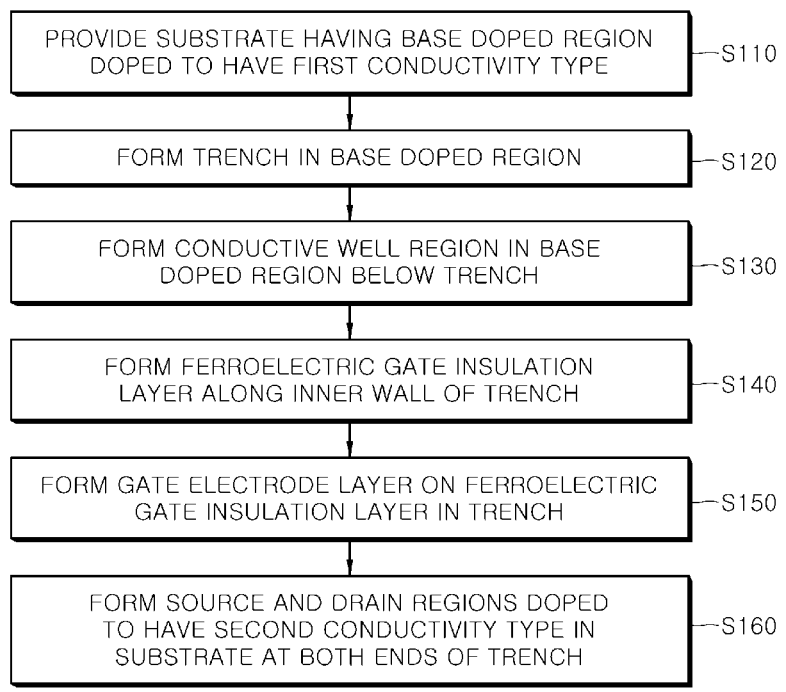
FIG. 4 is a flow chart schematically illustrating a method of manufacturing a ferroelectric memory device according to an embodiment of the present disclosure.

FIG. 4 is a flow chart schematically illustrating a method of manufacturing a ferroelectric memory device according to an embodiment of the present disclosure. FIGS. 5 to 10 are cross-sectional views schematically illustrating a method of manufacturing a ferroelectric memory device 1 of FIG. 1 according to an embodiment of the present disclosure.

Figure 5:
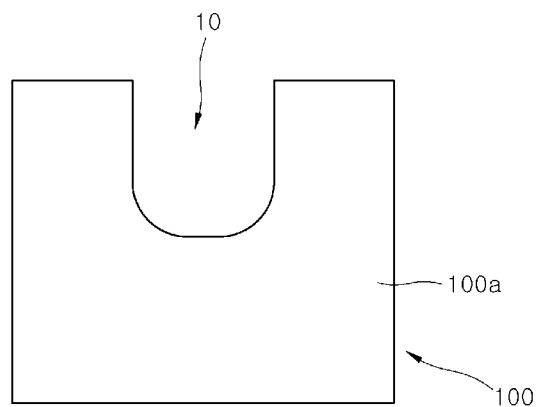
FIGS. 5 to 10 are cross-sectional views schematically illustrating a method of manufacturing a ferroelectric memory device 1 of FIG. 1 according to an embodiment of the present disclosure.

Referring to step S110 of FIG. 4 and FIG. 5, in an embodiment, a substrate 100 having a base doped region 100a doped to have a first conductivity type may be prepared. The substrate 100 may include a semiconductor material. In an embodiment, the substrate 100 may be a silicon substrate doped to have n-type conductivity or p-type conductivity.

In an example, the base doped region 100a may be formed by injecting dopants into the substrate 100. In another example, the base doped region 100a may be formed throughout the substrate 100. In yet another example, a commercially available substrate prepared by doping with a dopant of the first conductivity type can be utilized.

Referring to step S120 of FIG. 4 and FIG. 5, in an embodiment, a trench 10 may be formed in the base doped region 100a. The trench 10 may be formed to extend from a surface of the substrate 100 to an inner region of the base doped region 100a. The trench 10 may be formed by selectively etching the substrate 10 using an anisotropic etching method, for example.

Figure 6:
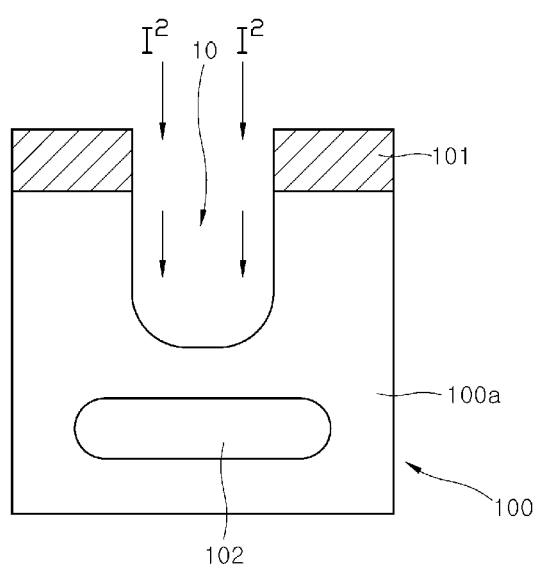

Referring to step S130 of FIG. 4 and FIG. 6, dopants of a second conductivity type may be injected into the substrate 100 to form a conductive well region 102 in the base doped region 100a below the trench 10. The conductive well region 102 may be formed to be electrically floated. In an embodiment, the conductive well region 102 is formed using processes to form a mask pattern 101 exposing the trench 10 on the substrate 100 and to inject dopants into the trench 10. As shown in FIG. 6, injection of the dopants may be performed using an ion implantation method ($I^2$). A process condition of the ion implantation method ($I^2$) may be controlled so that the conductive well region 102 is spaced apart from and under a bottom surface of the trench 10. After the ion implantation method is completed, the mask pattern 101 may be removed.

Figure 7:
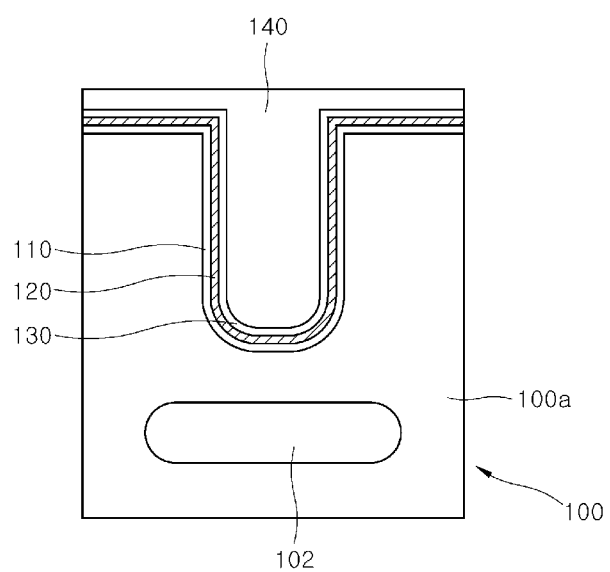

Referring to step S140 of FIG. 4 and FIG. 7, an interfacial insulation layer 110 may be formed along an inner wall of the trench 10. Then, a ferroelectric gate insulation layer 120 may be formed on the interfacial insulation layer 110. In some embodiments, the interfacial insulation layer 110 may be omitted.

The interfacial insulation layer 110 may include a nitride material, an oxide material or an oxynitride material, as non-limiting examples. The interfacial insulation layer 110 may include a silicon oxide material, a silicon nitride material, a silicon oxynitride material, an aluminum oxide material, or a combination of two or more thereof, as non-limiting examples. The interfacial insulation layer 110 may be formed using a chemical vapor deposition method or an atomic layer deposition method, as non-limiting examples.

The ferroelectric gate insulation layer 120 may include a hafnium oxide material, a zirconium oxide material, a hafnium zirconium oxide material, or a combination of two or more thereof, as non-limiting examples. In an embodiment, the ferroelectric gate insulation layer 120 may include at least one dopant. The dopant may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof, as non-limiting examples. The ferroelectric gate insulation layer 120 may, for example, be formed using a chemical vapor deposition method or an atomic layer deposition method.

Referring to step S150 of FIG. 4 and FIG. 7, a gate electrode layer 130 may be formed on the ferroelectric gate insulation layer 120. The gate electrode layer 130 may include at least one of tungsten (W), titanium (Ti), copper (Cu), aluminum (Al), platinum (Pt), iridium (Ir), ruthenium (Ru), a tungsten nitride material, a titanium nitride material, a tantalum nitride material, an iridium oxide material, a ruthenium oxide material, a tungsten carbide material, a titanium carbide material, a tungsten silicide material, a titanium silicide material, a tantalum silicide material, or a combination or an alloy of two or more thereof, as non-limiting examples. The gate electrode layer 130 may be formed using a chemical vapor deposition method, an atomic layer deposition method, or a sputtering method, as non-limiting examples.

Next, as illustrated in FIG. 7, a conductive layer 140 may be formed on the gate electrode layer 130. The conductive layer 140 may be formed over the substrate 100 outside of the trench 10 while filling the interior of the trench 10. The conductive layer 140 may include tungsten (W), titanium (Ti), copper (Cu), aluminum (Al), platinum (Pt), iridium (Ir), ruthenium (Ru), a tungsten nitride material, a titanium nitride material, a tantalum nitride material, an iridium oxide material, a ruthenium oxide material, a tungsten carbide material, a titanium carbide material, a tungsten silicide material, a titanium silicide material, a tantalum silicide material, or a combination or an alloy of two or more thereof, as non-limiting examples. The conductive layer 140 may be formed as a single layer or formed in multiple layers. The conductive layer 140 may be made of a material having a different etching selectivity from that of the gate electrode layer 130.

Figure 8:
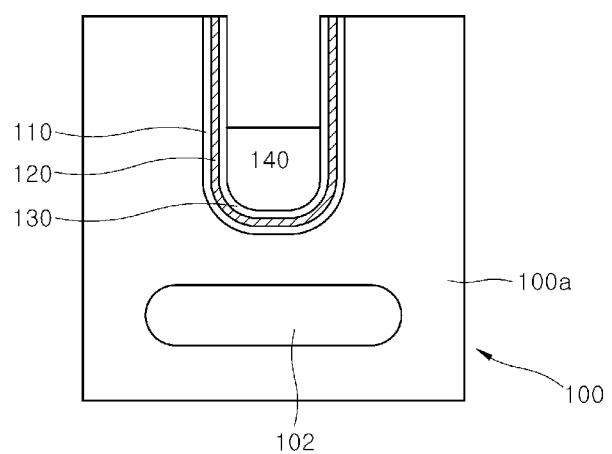

Referring to FIG. 8, the conductive layer 140, the gate electrode layer 130, the ferroelectric gate insulation layer 120, and the interfacial insulation layer 110 outside the trench 10 may be removed by a planarization process or a selective etching process. The removal process may be performed until a surface of the substrate 100 outside the trench 10 is exposed. Then, the conductive layer 140 may be etched back using the etching selectivity between the conductive layer 140 and the gate electrode layer 130 to recess the conductive layer 140 into the trench 10. As a result, the conductive layer 140 can be arranged to contact a portion of the gate electrode layer 130.

Figure 9:
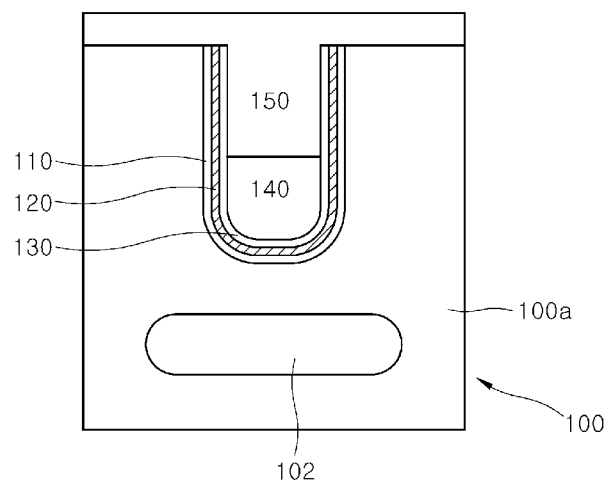

Referring to FIG. 9, a capping insulation layer 150 may be formed over the conductive layer 140 to fill the trench 10. The capping insulation layer 150 may also be formed on the substrate 100 outside the trench 10.

Figure 10:
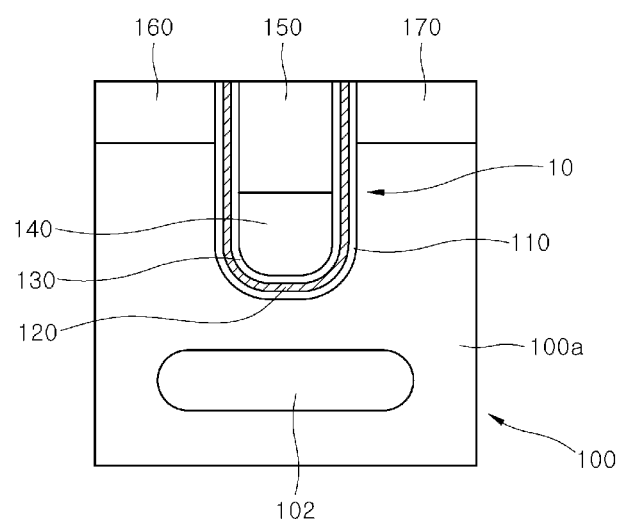

Referring to FIG. 10, a planarization process or a selective etching process may be performed to remove a portion of the capping insulation layer 150 so that an upper surface of the capping insulation layer 150 and an upper surface of the substrate 100 are positioned in substantially the same plane.

Referring to step S160 of FIG. 4 and FIG. 10, a source region 160 and a drain region 170 that are doped with a dopant of a second conductivity type may be formed in the regions of the substrate 100 at respective ends of, or on opposite sides of, the trench 10, respectively. The source and drain regions 160 and 170 may be formed by selectively implanting dopants into the substrate 100. The dopants may be implanted using an ion implantation method, as non-limiting examples. As a result, the base doped region 100a and the source region 160; the base doped region 100a and the drain region 170; and the base doped region 100a and the conductive well region 102 may, respectively, form p-n junctions.

By proceeding through the processes described above and with reference to FIGS. 1, and 4 through 10, a ferroelectric memory device according to an embodiment of the present disclosure can be manufactured.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A ferroelectric memory device comprising:
   a substrate having a base doped region with a dopant of a first conductivity type;
   a ferroelectric gate insulation layer and a gate electrode layer that are sequentially disposed along an inner wall of a trench formed in the base doped region;
   a source region and a drain region, each with a dopant of a second conductivity type and disposed in the substrate at respective ends of the trench;
   a conductive well region including conductive carriers, disposed below the trench and in the base doped region, the conductive well region with the dopant of the second conductivity type; and
   a channel layer formed in an interface region between the base doped region and the ferroelectric gate insulation layer,
   wherein the conductive well region is configured to provide conductive carriers into the interface region when a gate voltage is applied to the gate electrode layer without altering the orientation of the remanent polarization in the ferroelectric gate insulation layer.

2. The ferroelectric memory device of claim 1,
   wherein the channel layer is formed in the base doped region when the gate voltage is applied to the gate electrode layer, and a thickness of the channel layer formed in the base doped region adjacent to a bottom surface of the trench is greater than a thickness of the channel layer formed in the base doped region adjacent to a sidewall of the trench.

3. The ferroelectric memory device of claim 2,
   wherein, when a read operation voltage is applied between the source region and the drain region while maintaining the gate voltage,
   a forward p-n junction is formed between the source region and the base doped region;
   a reverse p-n junction is formed between the base doped region and the drain region; and
   the conductive well region is electrically floated.

4. The ferroelectric memory device of claim 3,
   wherein the source region, the base doped region, and the conductive well region together perform a bipolar junction switching operation; and
   wherein the conductive well region, the base doped region, and the drain region together perform a bipolar junction switching operation.

5. The ferroelectric memory device of claim 1,
   wherein the substrate is a silicon substrate and the first conductivity type is a p-type;

wherein the source region and the drain region are in contact with the base doped region; and wherein the second conductivity type is an n-type.

6. The ferroelectric memory device of claim 1, further comprising an interfacial insulation layer disposed between the inner wall of the trench and the ferroelectric gate insulation layer.

7. The ferroelectric memory device of claim 6, wherein the interfacial insulation layer comprises at least one selected from a silicon oxide material, a silicon nitride material, a silicon oxynitride material, and an aluminum oxide material.

8. The ferroelectric memory device of claim 1, wherein the ferroelectric gate insulation layer comprises at least one of a hafnium oxide material, a zirconium oxide material, and a hafnium zirconium oxide material.

9. The ferroelectric memory device of claim 8, wherein the ferroelectric gate insulation layer comprises at least one dopant selected from carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), and lanthanum (La).

10. The ferroelectric memory device of claim 1, wherein the gate electrode layer comprises at least one of tungsten (W), titanium (Ti), copper (Cu), aluminum (Al), platinum (Pt), iridium (Ir), ruthenium (Ru), a tungsten nitride material, a titanium nitride material, a tantalum nitride material, an iridium oxide material, a ruthenium oxide material, a tungsten carbide material, a titanium carbide material, a tungsten silicide material, a titanium silicide material, and a tantalum silicide material.

11. The ferroelectric memory device of claim 1, wherein, when a read operation voltage is applied between the source region and the drain region while maintaining the gate voltage, a forward p-n junction is formed between the source region and the base doped region;

a reverse p-n junction is formed between the base doped region and the drain region; and the conductive well region is electrically floated.

* * * * *